United States Patent [19]

Luich

[11] Patent Number: 5,473,283
[45] Date of Patent: Dec. 5, 1995

[54] CASCODE SWITCHED CHARGE PUMP CIRCUIT

[75] Inventor: Thomas M. Luich, Puyallup, Wash.

[73] Assignee: National Semiconductor Corporation, Santa Clara, Calif.

[21] Appl. No.: 335,091

[22] Filed: Nov. 7, 1994

[51] Int. Cl.$^6$ ................................................. H03L 7/089
[52] U.S. Cl. ............................. 331/8; 331/17; 331/25; 327/157
[58] Field of Search ........................... 331/8, 17, 25; 327/148, 157

[56] References Cited

U.S. PATENT DOCUMENTS

| | | | |
|---|---|---|---|
| 4,745,372 | 5/1988 | Miwa | 331/8 |
| 4,814,726 | 3/1989 | Byrd et al. | 331/1 A |
| 5,068,628 | 11/1991 | Ghoshal | 331/1 A |
| 5,153,530 | 10/1992 | Takagi et al. | 331/17 |
| 5,164,889 | 11/1992 | Ruetz | 363/60 |
| 5,220,294 | 6/1993 | Ichikawa | 331/17 |
| 5,233,314 | 8/1993 | McDermott et al. | 331/17 |

FOREIGN PATENT DOCUMENTS 0054322  6/1982  European Pat. Off. .
0238041  9/1987  European Pat. Off. .

Primary Examiner—Siegfried H. Grimm
Attorney, Agent, or Firm—Limbach & Limbach; H. Donald Nelson; Richard J. Roddy

[57] ABSTRACT

A low leakage, metal oxide semiconductor field effect transistor (MOSFET) charge pump circuit includes P- and N-MOSFET current mirrors, P- and N-MOSFET current switches and an output node. The P-MOSFET current mirror sources an output current which is switched by the P-MOSFET current switch in accordance with a pump-up control signal to provide a pump-up current. The width of the channel of the P-MOSFET current switch is substantially less than the sum of the widths of the channels of the P-MOSFETs of the P-MOSFET current mirror. The N-MOSFET current switch, in accordance with a pump-down control signal, switches a pump-down current which is sunk by the N-MOSFET current mirror. The width of the channel of the N-MOSFET current switch is substantially less than the sum of the widths of the channels of the N-MOSFETs of the N-MOSFET current mirror. The output node couples the P- and N-MOSFET current switches and receives the pump-up current and provides the pump-down current to provide a net charge pump signal suitable for use by a voltage controlled oscillator within a phase lock loop.

27 Claims, 18 Drawing Sheets

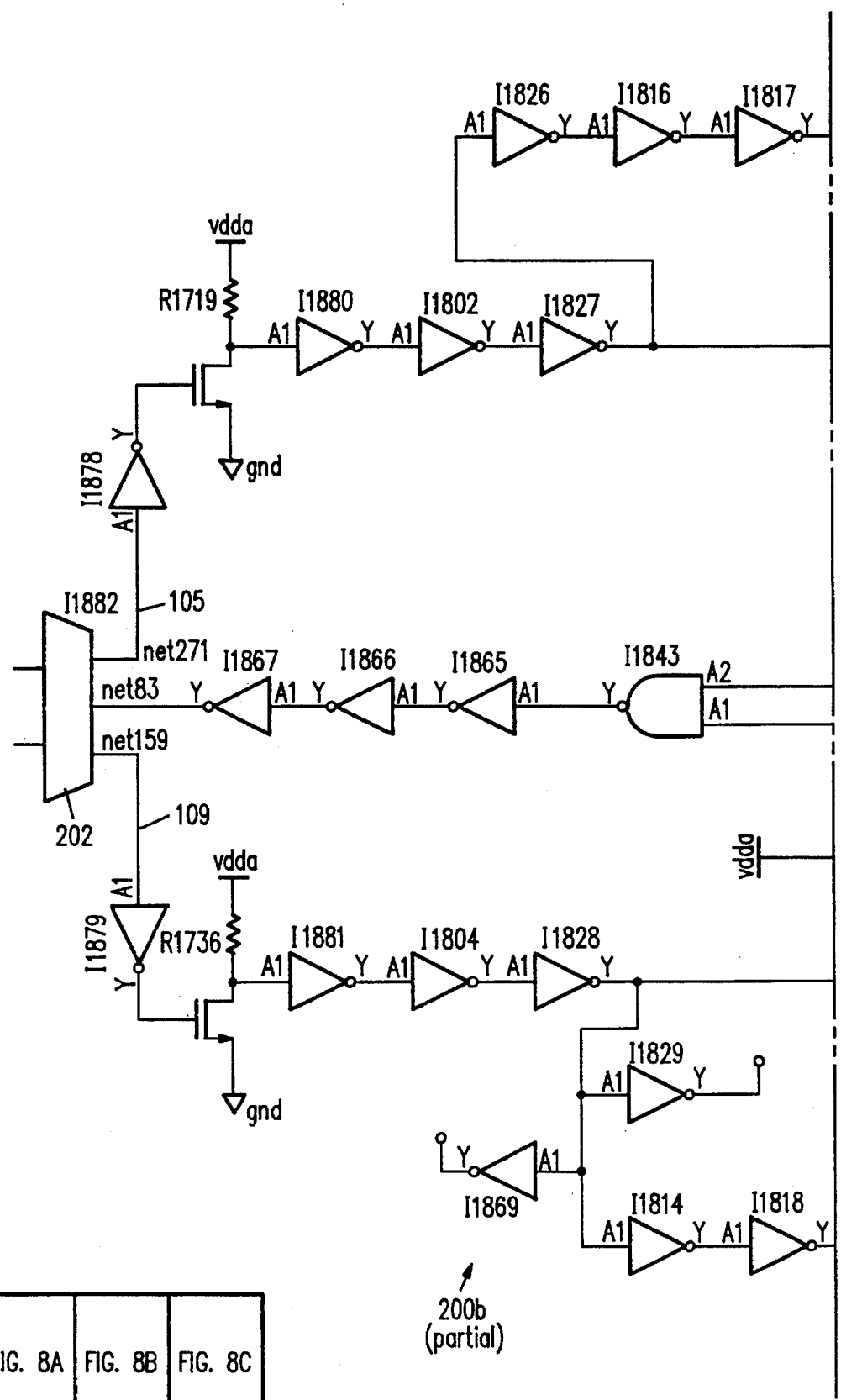
FIG. 8A
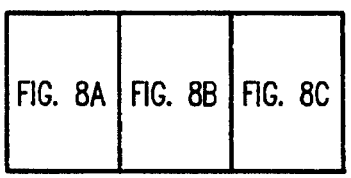
KEY TO FIG. 8

CASCODE SWITCHED CHARGE PUMP CIRCUIT

BACKGROUND OF THE INVENTION

1. Field of the Invention

The present invention relates to charge pump circuits, and in particular, to charge pump circuits using metal oxide semiconductor field effect transistors (MOSFETs).

2. Description of the Related Art

Charge pump circuits, in general, are well known in the art. Such circuits are used when a circuit node needs to be charged to some predetermined voltage level. For example, referring to FIG. 1, one common application for charge pump circuits is a phase lock loop. In accordance with well known principles, the output signal from a voltage controlled oscillator (VCO) is divided down (in frequency) and compared against a reference oscillator signal. This comparison is done with a phase comparator, or phase detector, with the charge pump circuit being part of the phase comparator. The output from the phase comparator is filtered by a loop filter (e.g. low pass) to produce, at an output node, a dc voltage for driving the VCO.

Referring to FIG. 2, one form of conventional charge pump circuit 10 includes a "pump-up" current mirror 12 with an associated input current switch 14 and a "pump-down" current mirror 16 with an associated output current switch 18, coupled together at an output node 20. The first current mirror 12 has an input P-MOSFET 22 whose drain and gate terminals are connected to the gate terminal of an output P-MOSFET 24. The source terminals of these P-MOSFETs 22, 24 are connected to the positive supply voltage VDD. The incoming pump-up signal 15 is a positive logic binary signal which turns the N-MOSFET 14 input current switch off and on to establish an input reference current $I_{REF1}$ through the input P-MOSFET 22 and current limiting resistor 26. This reference current $I_{REF1}$ is replicated, or "mirrored", in the output P-MOSFET 24 to provide a pump-up current $I_{PU}$.

The second current mirror 16 is the "analog" of the first current mirror 12, i.e. with N-MOSFETs and P-MOSFETs substituted for P-MOSFETs and N-MOSFETs, respectively. Accordingly, the incoming pump-down signal 19, which is a negative logic binary signal, turns the P-MOSFET 18 input current switch off and on to establish an input reference current $I_{REF2}$ through the input P-MOSFET 28 and current limiting resistor 32. This reference current $I_{REF2}$ is replicated in the output N-MOSFET 30 to sink a pump-down current $I_{PD}$.

Frequently, it is necessary to source a relatively large pump-up current $I_{PU}$ and sink a relatively large pump-down current $I_{PD}$ to and from the output node 20, respectively. Accordingly, the output, or driver, MOSFETs 24, 30 are typically actually several MOSFETs connected in parallel with one another with each one replicating the input, or reference, current. For example, in the charge pump circuit 10 of FIG. 2, the output P-MOSFET 24 and N-MOSFET 30 each actually represent a number of such devices (e.g. 5–10 each) connected in parallel. This allows the replicating action of the current mirrors 12, 16 to also introduce multiplication factors into such current replication process.

While this type of charge pump circuit is well suited to many applications, a number of drawbacks nonetheless exist. For example, the size of the output MOSFETs 24, 30 are typically quite large due to the relatively high output current demands (e.g. sourcing and sinking) and the dynamic output voltage range. Such large devices are subject to high leakage currents due to scalable effects such as subthreshold leakage, gate induced drain-to-well leakage and parasitic Schottky diode (drain-to-well) leakage caused by shallow junctions. Such leakage effects are at best undesirable and at worst quite problematic in many applications. For example, for a phase lock loop (e.g. FIG. 1) in which the charge pump circuit 10 is to be operated in an open loop mode for any period of time, such as for open loop modulation, such leakage results in an unstable VCO tuning voltage at the output node 20. This, in turn, causes problems with respect to frequency stability at the output of the VCO in the form of unwanted frequency deviation, higher output noise levels and higher magnitude spurious signals due to the phase loop reference.

One way to reduce these leakage effects would be scale down the current mirror devices, particularly the output MOSFETs 24, 30. However, this would have the undesirable effect of increasing the effective series resistance of the MOSFET channels thereby reducing the operating range of the current mirror (e.g. useable output voltage $V_{DS}$), as well as increasing the gate voltage necessary for driving the MOSFET to provide the same amount of output current. Furthermore, scaling down the devices can result in "short" MOSFET channels (e.g. less than 0.5 micron). This is undesirable due to well known problems caused by short channel effects. Therefore, it is desirable to maintain "long" MOSFET channels (e.g. approximately 2 microns). Accordingly, in order to keep the MOSFET channel resistance constant, the channel width must then also be proportionately higher, consistent with the length of the channel.

Another problem associated with this conventional charge pump circuit 10 relates to the fact that the input reference currents $I_{REF1}$, $I_{REF2}$ for the current mirrors 12, 16 are typically switched on only during a pump condition. Generally, the reference currents $I_{REF1}$, $I_{REF2}$ are kept as small as possible so as to minimize power consumption. This results in time constants at the gate terminals of the output MOSFETs 24, 30 being long due to the large dimensions of the output MOSFETs 24, 30 (as noted above). Due to such long time constants, the time required for the pump currents $I_{PU}$, $I_{PD}$ to reach their final values, both on and off, are also long. This, in turn, can result in long pump correction times, resulting in excess accumulated charges at the output node 20, thereby causing further voltage fluctuation at the output node 20.

Accordingly, it would be desirable to have an improved charge pump circuit design which avoids the need for, and therefore the problems associated with, scaling down MOSFET device dimensions for minimizing leakage effects. It would be further desirable to have such an improved charge pump circuit design which also avoids the problems associated with long time constants associated with the pump-up and pump-down currents.

SUMMARY OF THE INVENTION

An apparatus with a low leakage, metal oxide semiconductor field effect transistor (MOSFET) charge pump circuit in accordance with one embodiment of the present invention includes two output current sources, two output controllers and an output node. The first output current source includes a number of MOSFETs for sourcing a first output current. The first output controller includes a MOSFET coupled to the first output current source and receives a pump-up control signal and the first output current and in accordance therewith provides a pump-up current. The first output controller MOSFET has a MOSFET channel with a channel width which is substantially less than the sum of the channel widths of the first output current source MOSFETs. The second output current source includes another number of MOSFETs for sinking a second output current. The second output controller includes a MOSFET coupled to the second output current source and receives a pump-down control signal and a pump-down current and in accordance therewith provides the second output current. The second output controller MOSFET has a MOSFET channel with a channel width which is substantially less than the sum of the channel widths of the second output current source MOSFETs. The output node couples the first and second output controllers, receives the pump-up current and provides the pump-down current and in accordance therewith provides a charge pump output signal.

A method of providing a charge pump signal with an apparatus including a low leakage, metal oxide semiconductor field effect transistor (MOSFET) charge pump circuit in accordance with one embodiment of the present invention includes the steps of: sourcing a first output current with a first output current source including a number of MOSFETs; receiving a pump-up control signal and the first output current and in accordance therewith outputting a pump-up current with a first output controller including a MOSFET with a channel having a channel width which is substantially less than the sum of the channel widths of the first output current source MOSFETs; sinking a second output current with a second output current source including another number of MOSFETs; receiving a pump-down control signal and a pump-down current and in accordance therewith outputting the second output current with a second output controller including a MOSFET with a channel having a channel width which is substantially less than the sum of the channel widths of the second output current source MOSFETs; and receiving the pump-up current and outputting the pump-down current with an output node and in accordance therewith generating a charge pump signal.

These and other features and advantages of the present invention will be understood upon consideration of the following detailed description of the invention and the accompanying drawings.

BRIEF DESCRIPTION OF THE DRAWINGS

FIGS. 8A, 8B and 8C together form a schematic diagram of another embodiment of the charge pump circuit represented in FIG. 4.

DETAILED DESCRIPTION OF THE INVENTION

Throughout the following discussion, unless indicated otherwise, it is assumed that all P-MOSFET and N-MOSFET substrates, or "bulks", are connected to their respective, associated power supply terminals (e.g. typically to power supply nodes VDD and VSS, respectively). Also, the alphanumeric legends alongside the various circuit elements in FIGS. 5A, 5B, 5C, 7, 8A, 8B and 8C provide various forms of information about such elements, such as the number of and channel widths and lengths of the transistors. (For example, in FIGS. 5A, 5B and 5C, P-MOSFET M1764 is actually two P-MOSFETs ("m=2") and their widths and lengths are 30 microns ("w=30μ") and 1 micron ("l=1μ"), respectively. Further, it is assumed that the circuit reference, or ground, node is the VSS terminal (typically with an associated reference, or ground, voltage potential of 0 volts).

Figure 1:
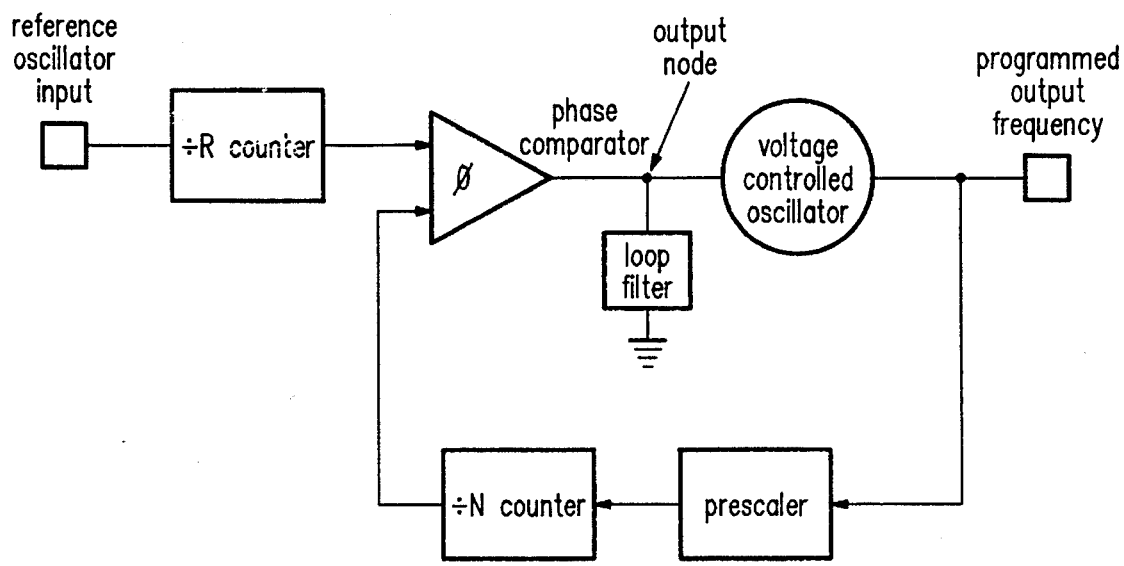
FIG. 1 is a functional block diagram of a conventional phase lock loop circuit.
Figure 2:
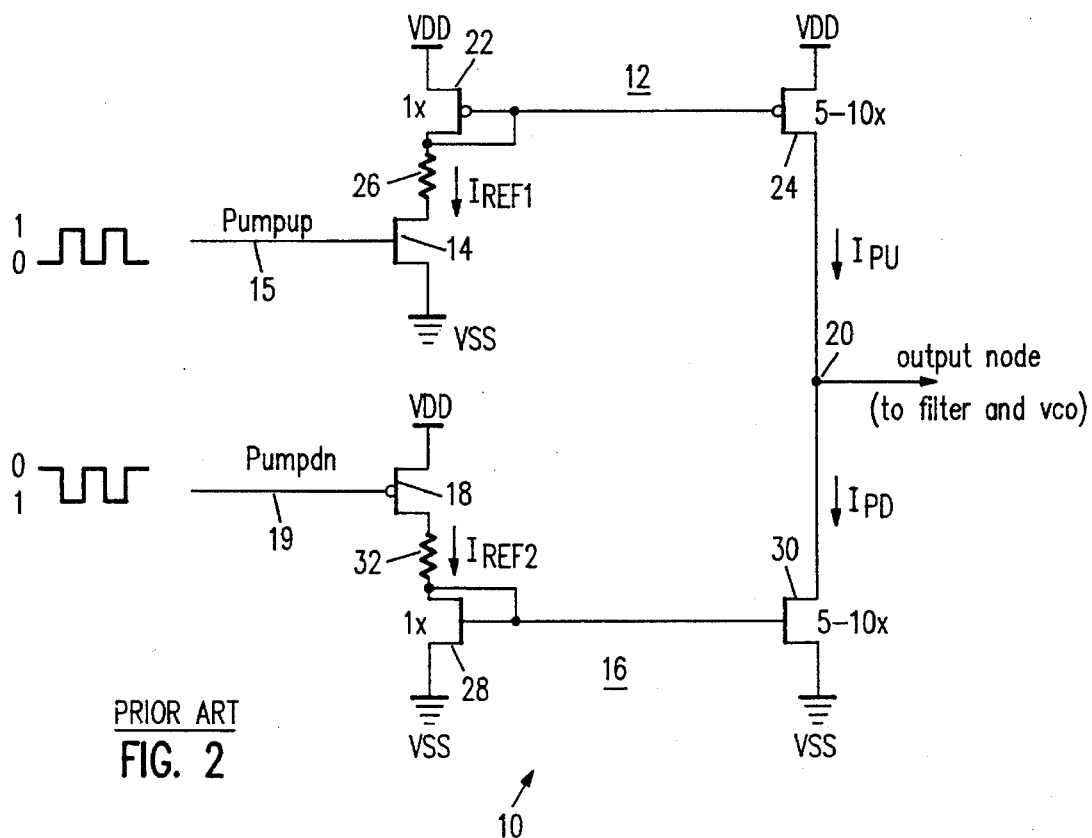
FIG. 2 is a simplified schematic representation of a conventional charge pump circuit.
Figure 3:
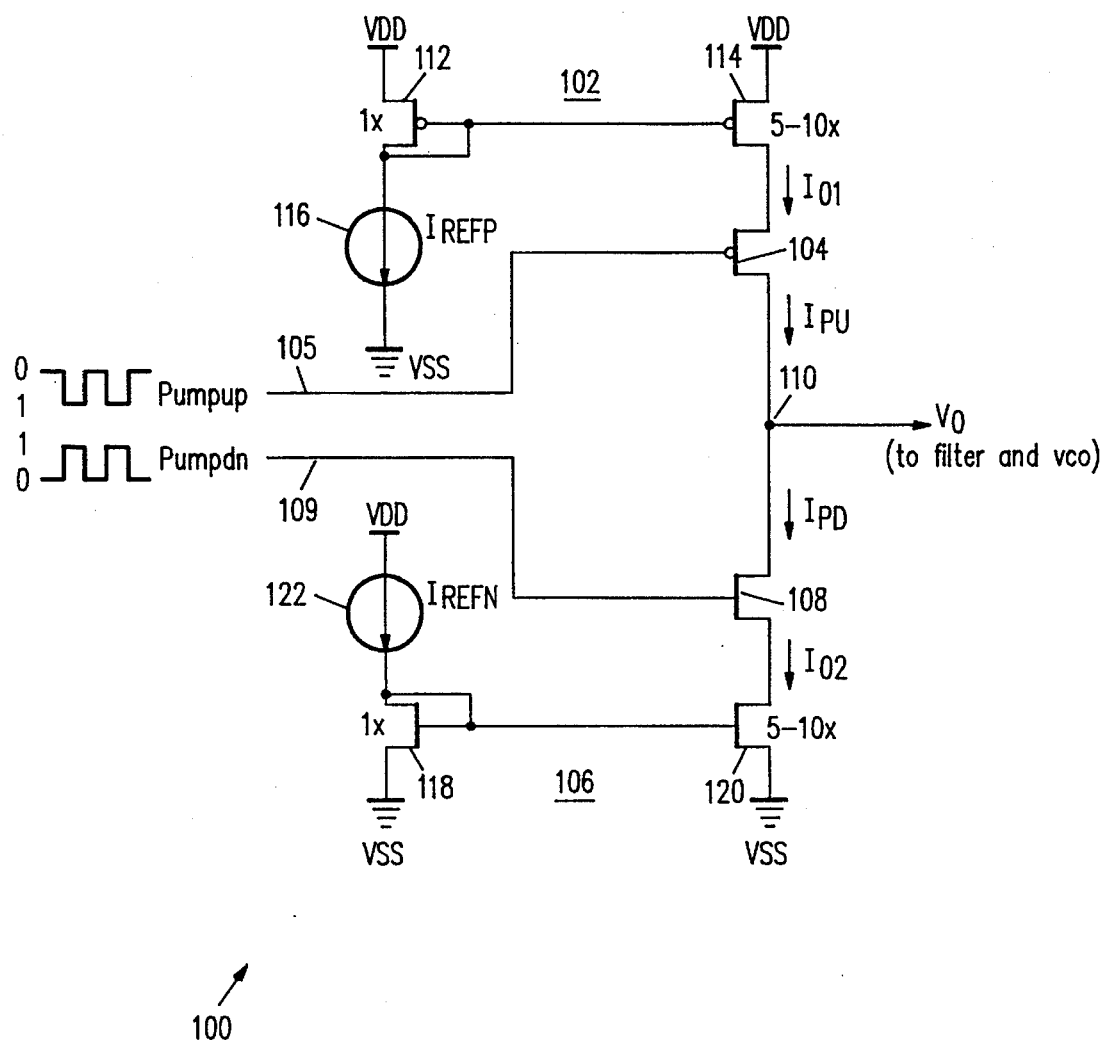
FIG. 3 is a simplified schematic representation of a charge pump circuit in accordance with one embodiment of the present invention.

Referring to FIG. 3, a charge pump circuit 100 in accordance with one embodiment of the present invention includes a current source 102 and an output source current control device 104 for providing a pump-up current $I_{PU}$ to an output node 110, and a current sink 106 and output sink current control device 108 for sinking a pump-down current $I_{PD}$ from the output node 110. The pump-up current source 102 is a P-MOSFET current mirror with an input P-MOSFET 112 and multiple output P-MOSFETs 114 (e.g. 5–10) connected in parallel. A reference current source 116 provides an input reference current $I_{REFP}$ for an input P-MOSFET 112. The resulting output current $I_{O1}$ from the output P-MOSFETs 114 is switched by the P-MOSFET 104 current control device in accordance with a negative logic pump-up control signal 105 to provide a pump-up current $I_{PU}$ to the output node 110.

Similarly, the current sink circuit 106 is an N-MOSFET current mirror with an input N-MOSFET 118 and multiple output N-MOSFETs 120 (e.g. 5–10) connected in parallel. A second reference current source 122 provides an input reference current $I_{REFN}$ to an input N-MOSFET 118. This results in an output current $I_{O2}$ which is sunk by the output N-MOSFETs 120. This output current $I_{O2}$ is provided by the N-MOSFET 108 current control device which switches the pump-down current $I_{PD}$ from the output node 110 in accordance with a positive logic pump-down control signal 109.

As should be appreciated, the charge pump circuit 100 of FIG. 3 has a number of advantages. For example, undesirable charge leakage effects at the output node 110, either due to incoming pump-up charge leakage or outgoing pump-down charge leakage, are avoided without requiring scaling down of the pump-up or pump-down driver MOSFETs 114, 120. Any leakage effects due to these devices 114, 120 are isolated from the output node 110 by the current control MOSFETs 104, 108. These series gates 104, 108 are sized according to the required pump currents $I_{PU}$, $I_{PD}$, and since their gate terminal drives are "rail-to-rail", these series gates 104, 108 can be made considerably smaller than the combined sizes of the current mirror output devices 114, 120. For example, with a conservative ratio of 4:1, a seventy-five percent (75%) reduction in leakage effects can be realized.

Figure 4:
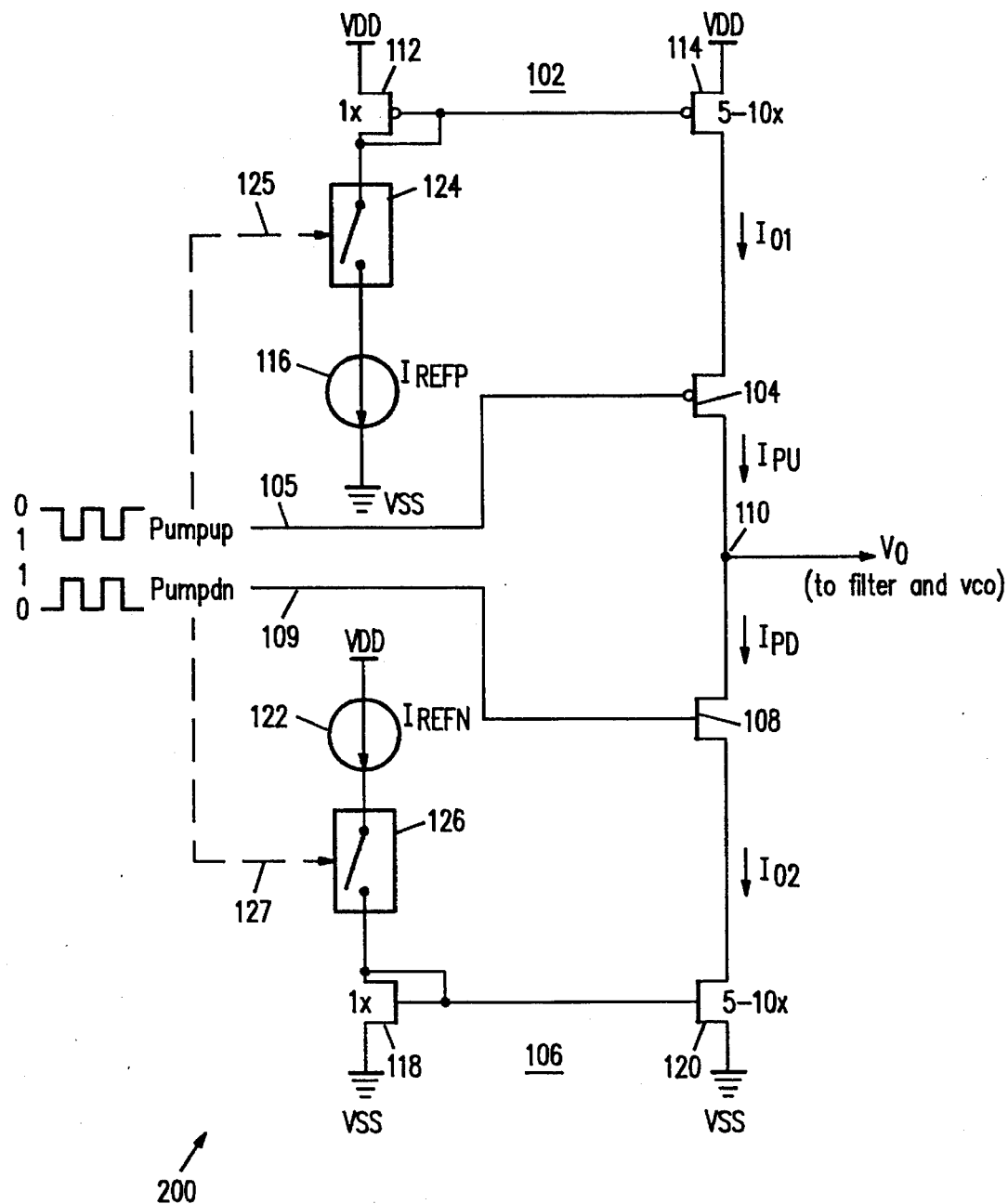
FIG. 4 is a simplified schematic representation of a charge pump circuit in accordance with another embodiment of the present invention.

Referring to FIG. 4, a charge pump circuit 200 in accordance with another embodiment of the present invention includes the current source 102, current sink 106, output current control devices 104, 108 and reference current sources 116, 122, as discussed above, plus two reference current controllers 124, 126 (e.g. current switching circuits). As shown, these reference current controllers 124, 126 allow the input reference currents $I_{REFP}$ and $I_{REFN}$ to be selectively enabled to flow or disabled from flowing through their respective current source 102 or current sink 106 circuits. The use of these reference current controllers 124, 126 advantageously reduces the potential for undesired accumulations of electrical charges at nodes within the current source 102 and current sink 106 circuits which can cause undesired spikes in the magnitudes of the various output currents $I_{O1}$, $I_{O2}$, $I_{PU}$, $I_{PD}$. (Such current spikes within the pump-up $I_{PU}$, pump-down $I_{PD}$ and net output $I_O$ currents ($I_O=I_{PU}+I_{PD}$) can cause corresponding transient and/or spurious signals at undesired output frequencies to appear at the output of the signal generating device (e.g. voltage-controlled oscillator) controlled by the charge pump circuit.) The current control signals 125, 127 can be independent from the pump-up 105 and pump-down 109 control signals or, alternatively, they can be the same signals thereby allowing the pump-up control signal 105 to control both the output source current control device 104 and its associated reference current controller 124 and the pump-down control signal 109 to control the output sink current control device 108 and its associated reference current controller 126.

Figure 5A:
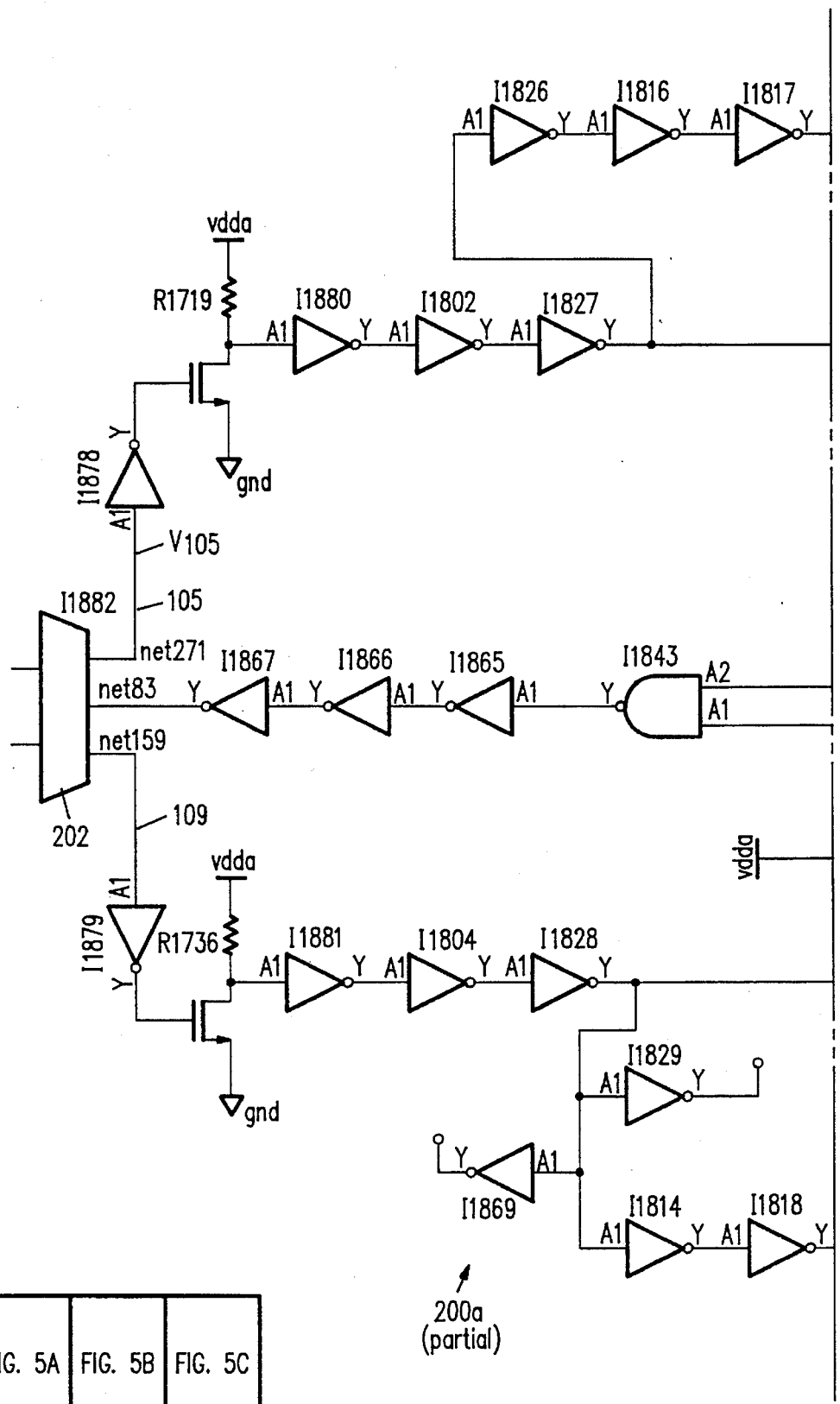
FIGS. 5A, 5B and 5C together form a schematic diagram of one embodiment of the charge pump circuit represented in FIG. 4.
Figure 5B:
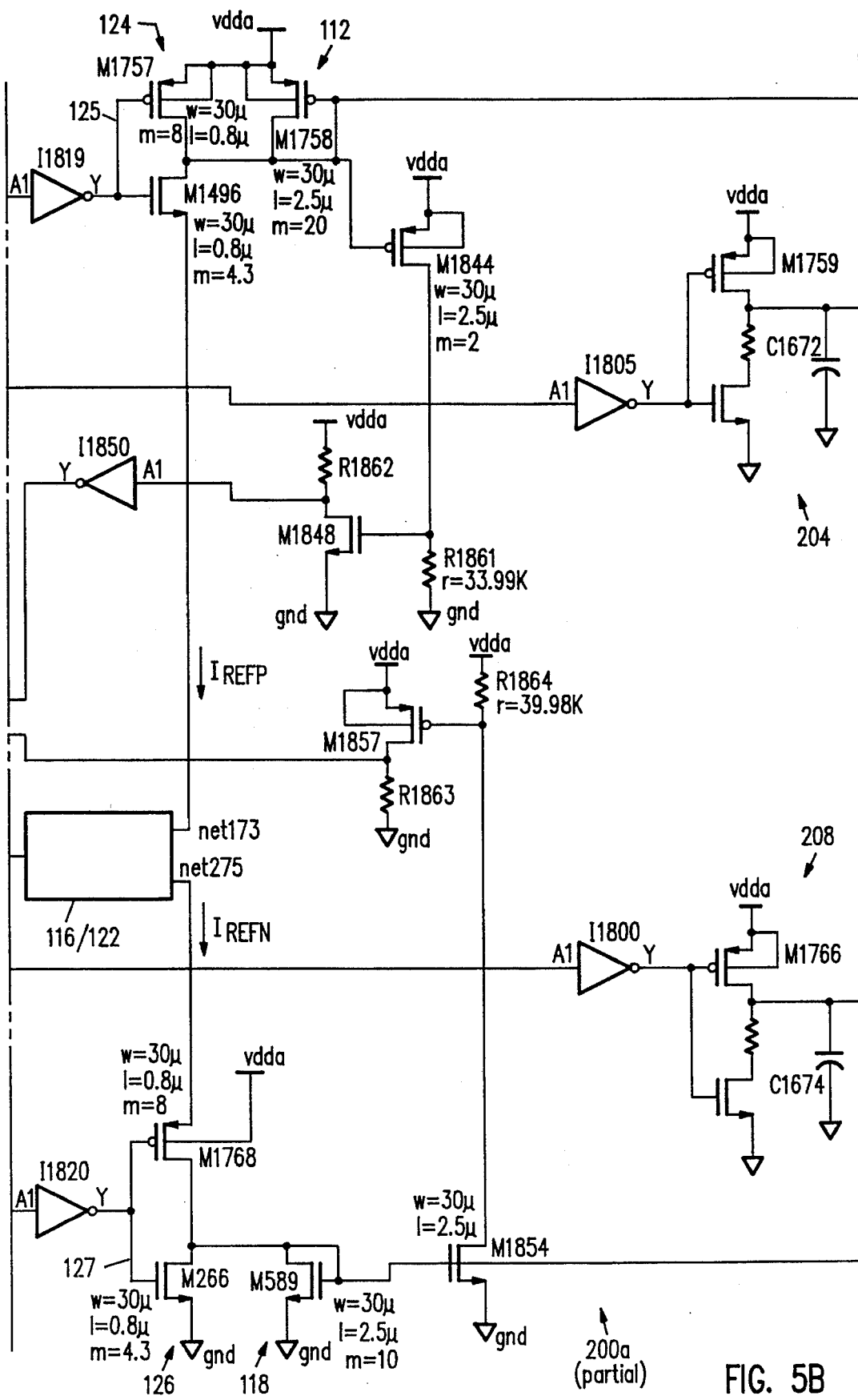
Figure 5C:
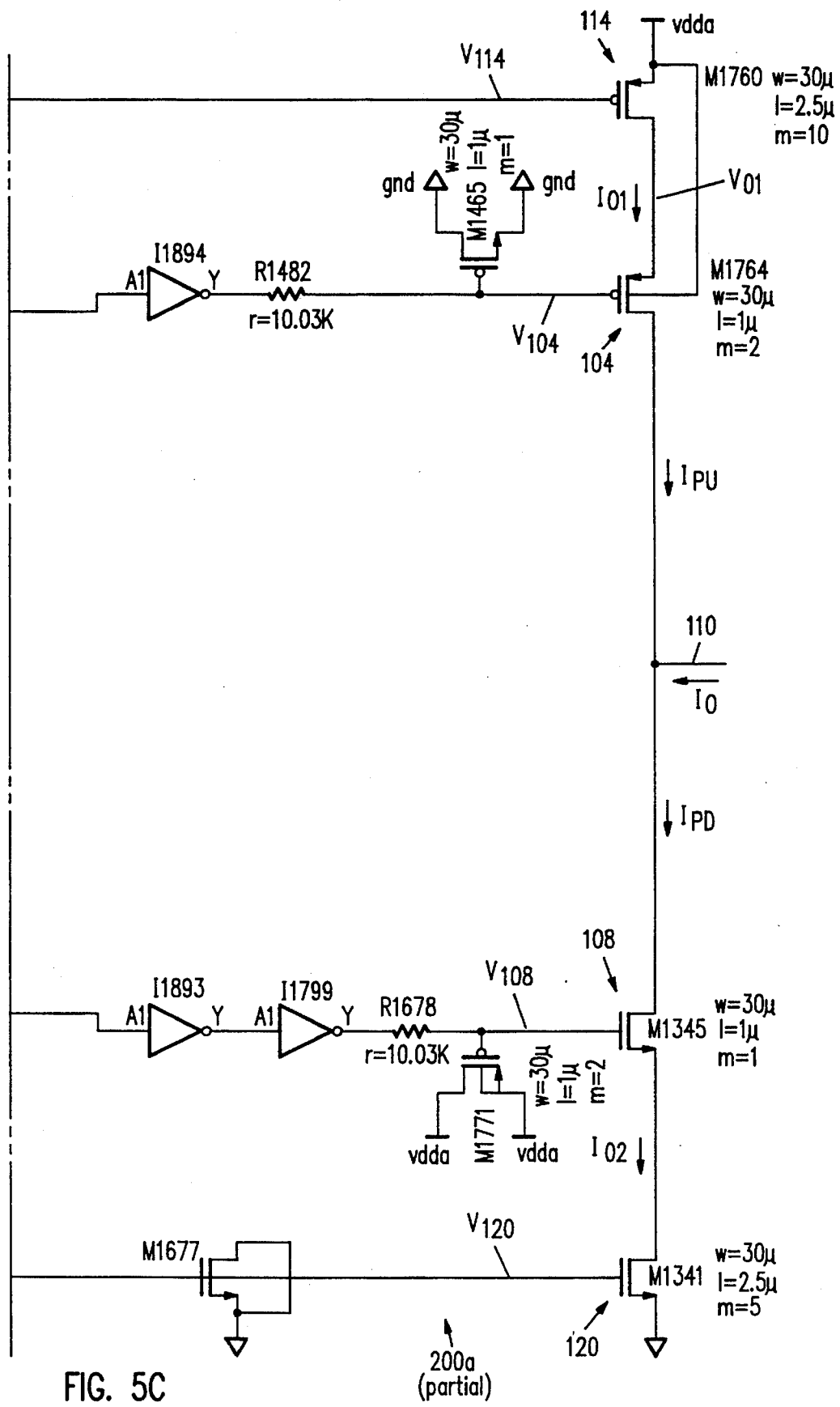

Referring to FIGS. 5A, 5B and 5C one embodiment 200a of the charge pump circuit 200 represented in FIG. 4 can be realized as shown. (Circuit elements corresponding to those represented in FIG. 4 are identified with corresponding numeric designators.) The pump-up and pump-down control signals 105, 109 are outputted by a phase comparator 202 and are used to drive the reference current controllers 124, 126, as discussed above. The reference currents $I_{REFP}$ and $I_{REFN}$ are replicated by their respective current mirror elements 112, 114, 118, 120. The resulting output currents $I_{O1}$, $I_{O2}$ are switched, or gated, by their respective output current control devices 104, 108 to source the pump-up current $I_{PU}$ to or sink the pump-down current $I_{PD}$ from the output node 110.

Also shown in the circuit 200a of FIGS. 5A, 5B and 5C is a feedback circuit which uses P-MOSFET M1844 and N-MOSFET M1854 driven by input current mirror devices 112 (M1758) and 118 (M589), respectively, to generate two signals for NANDing by NAND gate I1843 and provide a feedback signal to the phase comparator 202. The principles and advantages of this feedback to the phase comparator 202 are described in more detail in U.S. Pat. No. 4,814,726, issued on Mar. 21, 1989, the disclosure of which is incorporated herein by reference.

The pump-up and pump-down control signals 105, 109, before reaching the reference current controllers 124, 126 and output current control devices 104, 108, first pass through various series of signal inverter circuits. One reason for doing this is to provide some gain for the signals prior to using them for driving the reference current controllers 124, 126 and output current control devices 104, 108. A second, and more important, reason for doing this is to perform some waveshaping and introduce slight timing shifts between the leading and trailing edges of voltage signals $V_{114}$ and $V_{104}$ which drive (i.e. turn on and turn off) the output P-MOSFETs 114 and P-MOSFET 104 current control device and voltage signals $V_{120}$ and $V_{108}$ which drive the output N-MOSFETs 120 and N-MOSFET 108 current control device. For example, waveshaping circuits 204 and 208 in the pump-up and pump-down control signal paths, respectively, are used to cause voltage signal $V_{104}$ to have a fall time which is faster than its rise time and voltage signal $V_{108}$ to have a rise time which is faster than its fall time (due to the one additional inverter 11799).

Figure 6A:
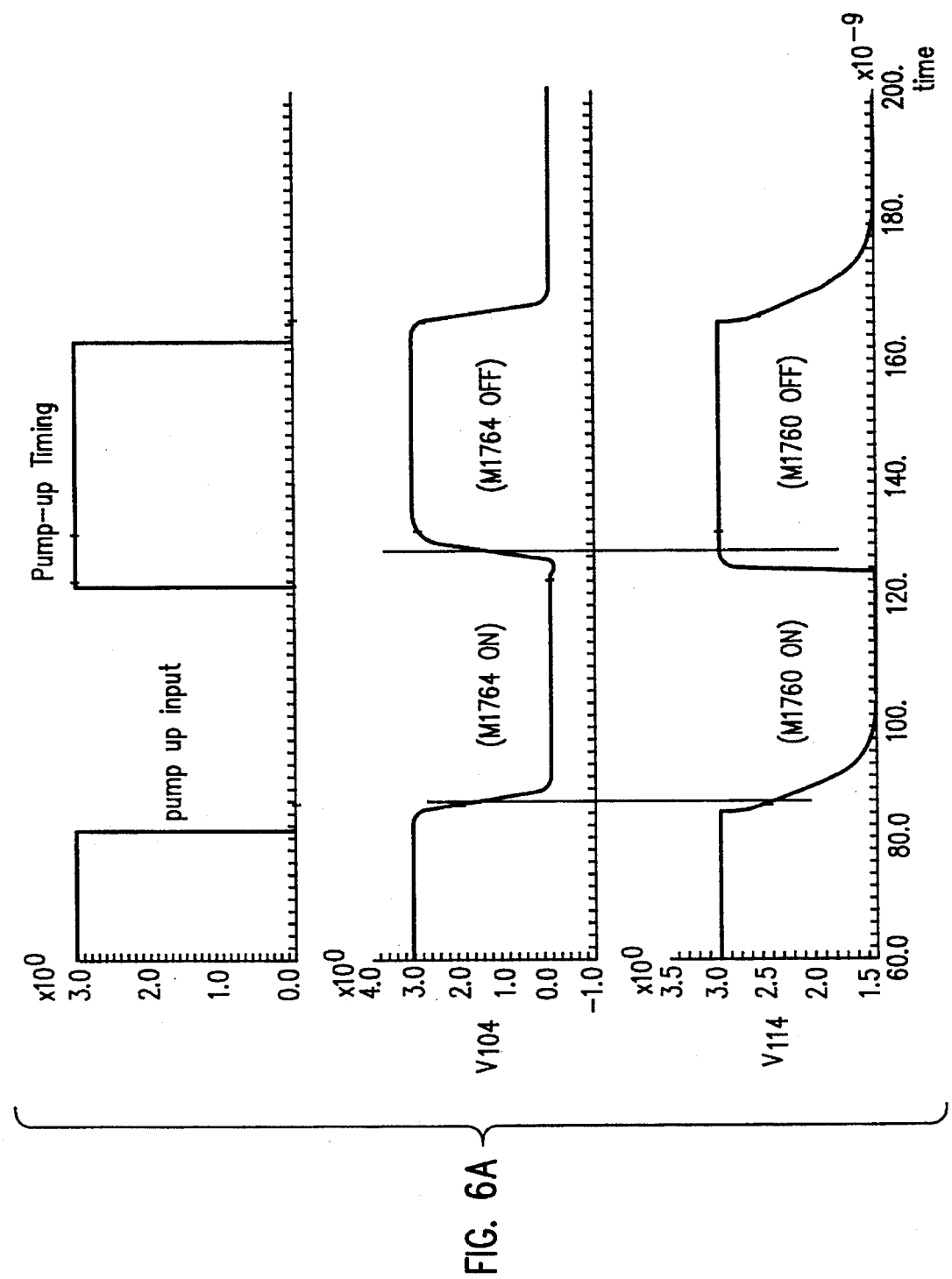
FIGS. 6A and 6B are timing diagrams for specific signals involved in generating the output signal(s) for the charge pump circuit of FIGS. 5A, 5B and 5C.

Referring to FIG. 6A, the results of the aforementioned waveshaping and timing shifts are shown for the pump-up control signals $V_{104}$, $V_{114}$. As shown, the falling edge of $V_{104}$ is faster than and slightly ahead in time of the corresponding falling edge of $V_{114}$, while the rising edge of $V_{104}$ is slower than and slightly behind in time from the corresponding rising edge of $V_{114}$. Accordingly, the output current control device 104 turns on slightly before and turns off slightly after the output P-MOSFETs 114.

Figure 6B:
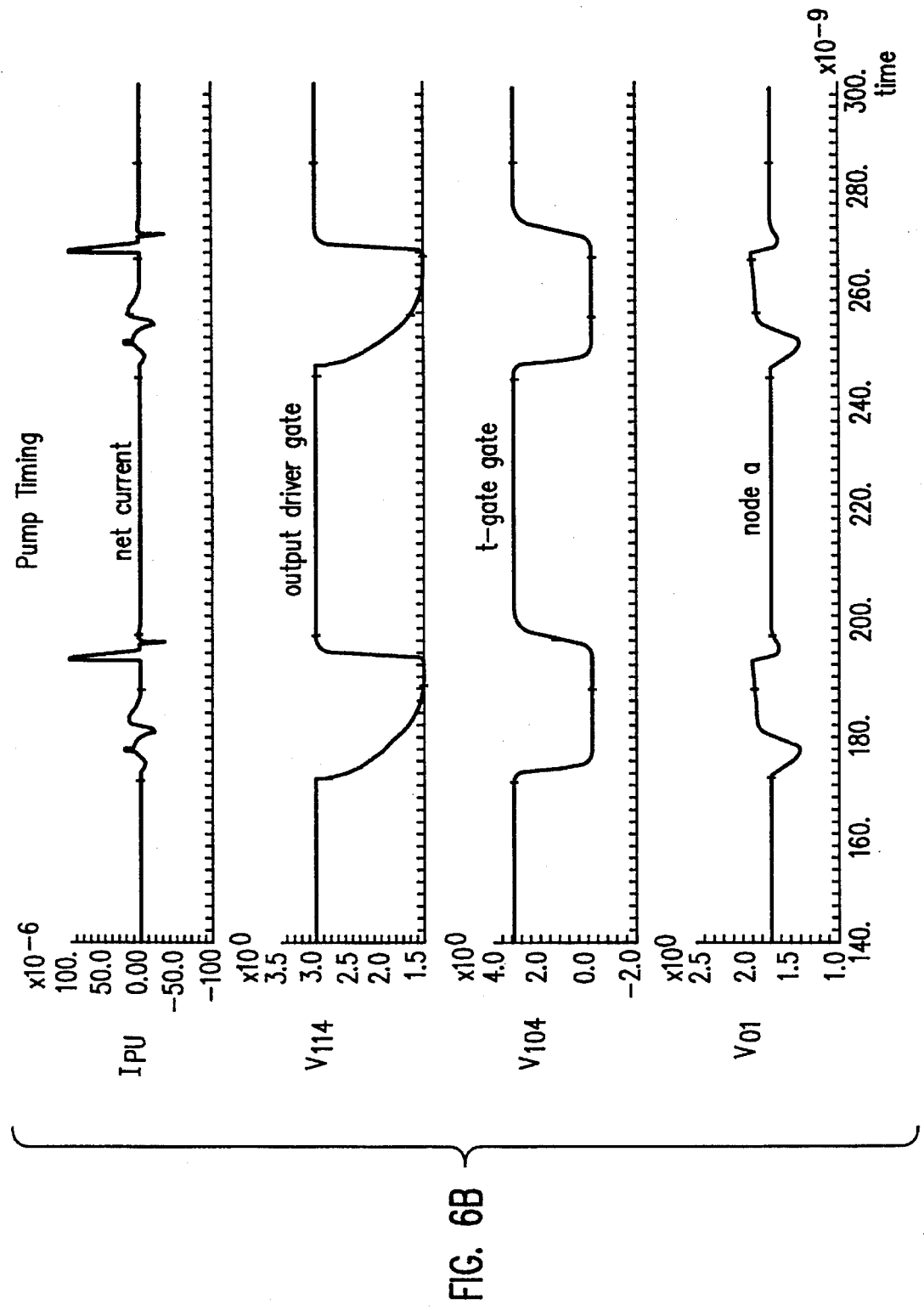

Referring to FIG. 6B, the effects of such waveshaping and timing shifts upon the pump-up current $I_{PU}$ is shown. The voltage $V_{O1}$ at the drain and source terminals of P-MOSFETs 114 and P-MOSFET 104, respectively, is substantially constant with only slight voltage perturbations due to the switching on and off of the output devices. Further, the net pump-up current $I_{PU}$ has few current spikes, and those which are present are very small in magnitude.

Figure 7:
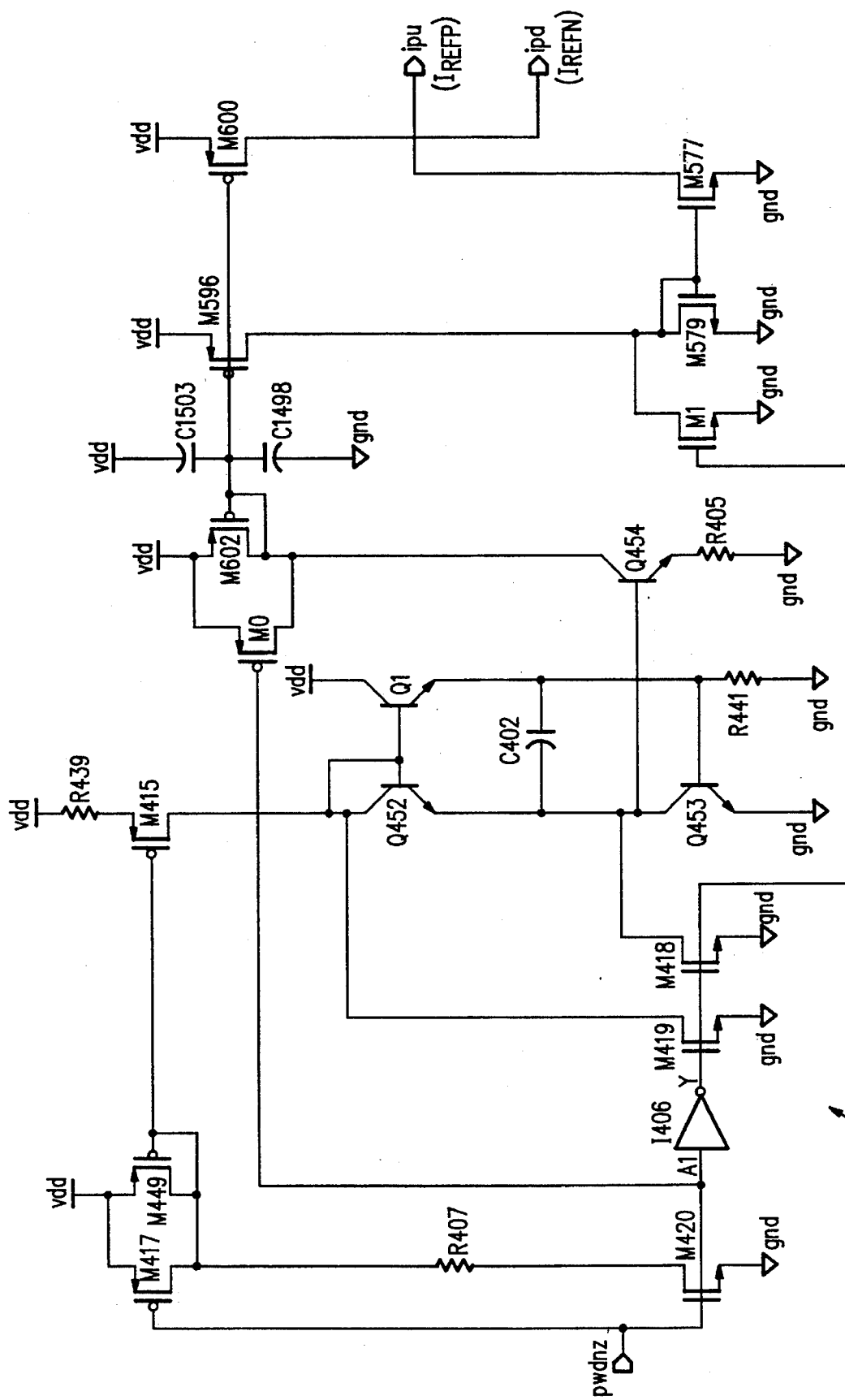
FIG. 7 is schematic diagram of the reference currents generator for the charge pump circuit of FIGS. 5A, 5B and 5C.

Referring to FIG. 7, a combination reference current source 116/122 for providing the above-discussed pump-up and pump-down reference currents $I_{REFP}$ and $I_{REFN}$, respectively, can be realized as shown. The input signal PWDNZ is normally tied high (at a logic 1), i.e. at VDD. However, this input PWDNZ can be driven low (at a logic 0) to cause this signal to enter a power-down mode and thereby conserve DC power when the reference currents $I_{REFP}$, $I_{REFN}$ are not needed.

Figure 8B:
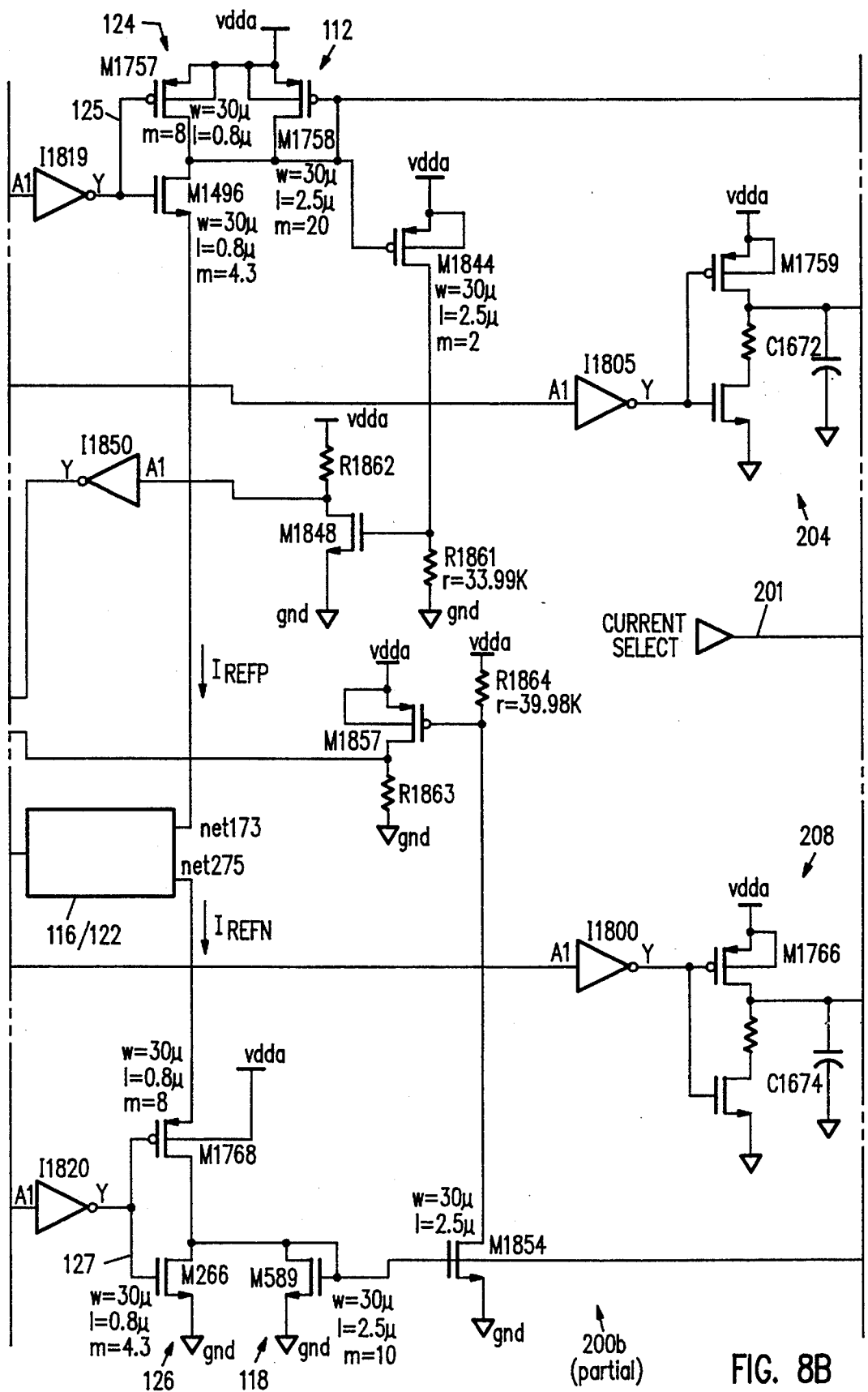
Figure 8C:
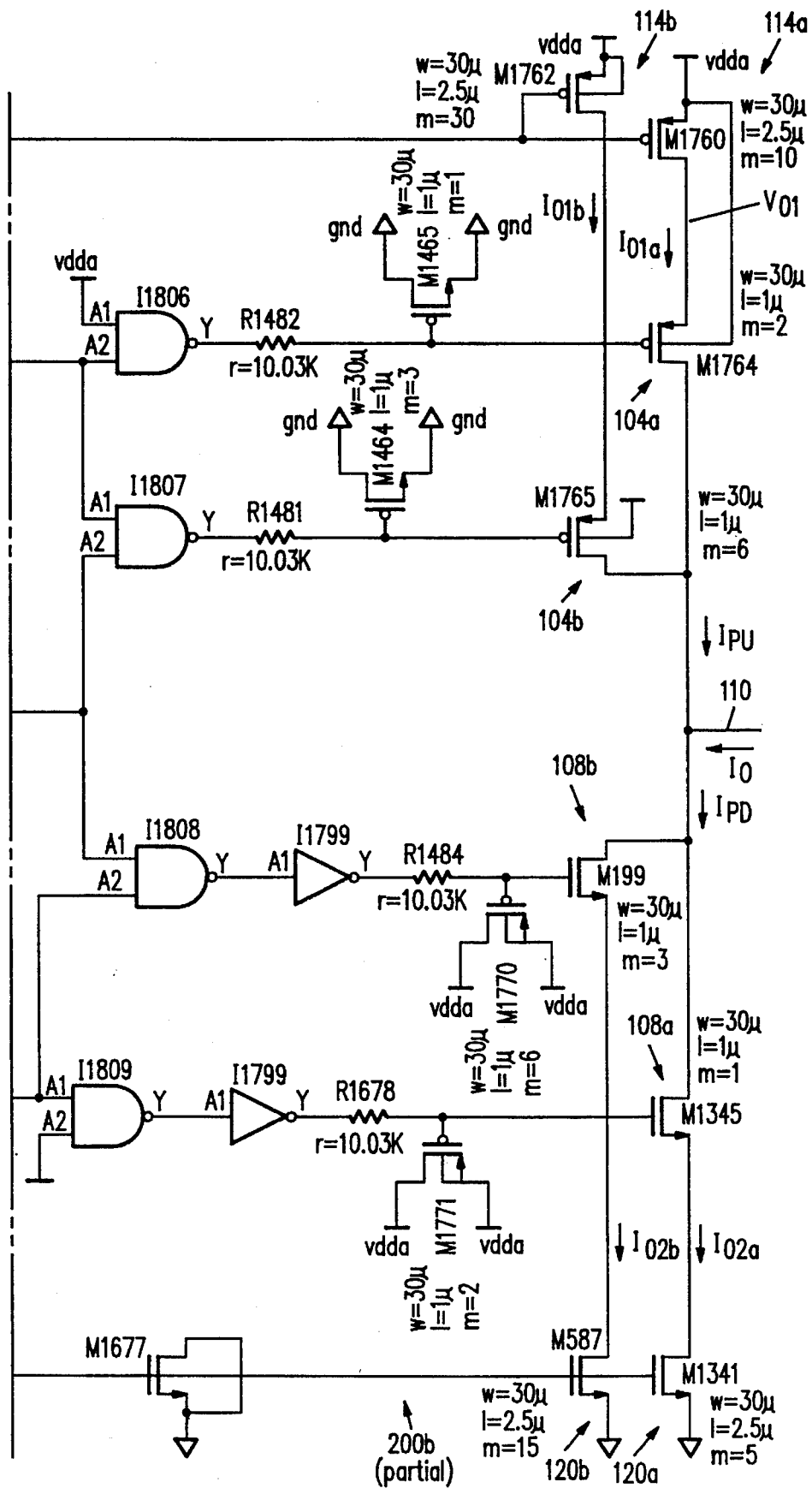

Referring to FIGS. 8A, 8B and 8C, another embodiment 200b of the charge pump circuit 200 represented in FIG. 4 is similar to and operates in accordance with the discussion above concerning the embodiment 200a shown in FIGS. 5A, 5B and 5C. However, this embodiment 200b allows the user, via a current select control signal 201, to select the magnitudes of the output pump-up $I_{PU}$ and pump-down $I_{PD}$ currents. The first sets of output P-MOSFETs 114a and N-MOSFETs 120a and their associated P-MOSFET 104a and N-MOSFET 108a current control devices operate as described above for the circuit 200a of FIGS. 5A, 5B and 5C. However, connected in parallel therewith are additional output P-MOSFETs 114b and N-MOSFETs 120b and associated P-MOSFET 104b and N-MOSFET 108b current control devices, respectively. Using the outputs 205, 209 of the waveshaping circuits 204, 208 as enabling signals for NAND gates I1807 and I1808, and in accordance with the current select control signal 201, the auxiliary sets of output MOSFETs 114b, 120b and current control devices 104b, 108b are turned on or off to increase or decrease, respectively; the pump-up current $I_{PU}$ and pump-down current $I_{PD}$ by a factor of four. In other words, when enabled (i.e. when current select control signal 201 is at a logic 1), output currents $I_{O1a}$ and $I_{O1b}$ (where $I_{O1b}=3I_{O1a}$)) sum together to form the pump-up current $I_{PU}$. The auxiliary output currents $I_{O1b}$ and $I_{O2b}$ are three times greater than the original output currents $I_{O1a}$ and $I_{O2a}$, respectively, since there are three times as many devices connected in parallel within the auxiliary sets 114b, 120b of output MOSFETs.

Figure 9A:
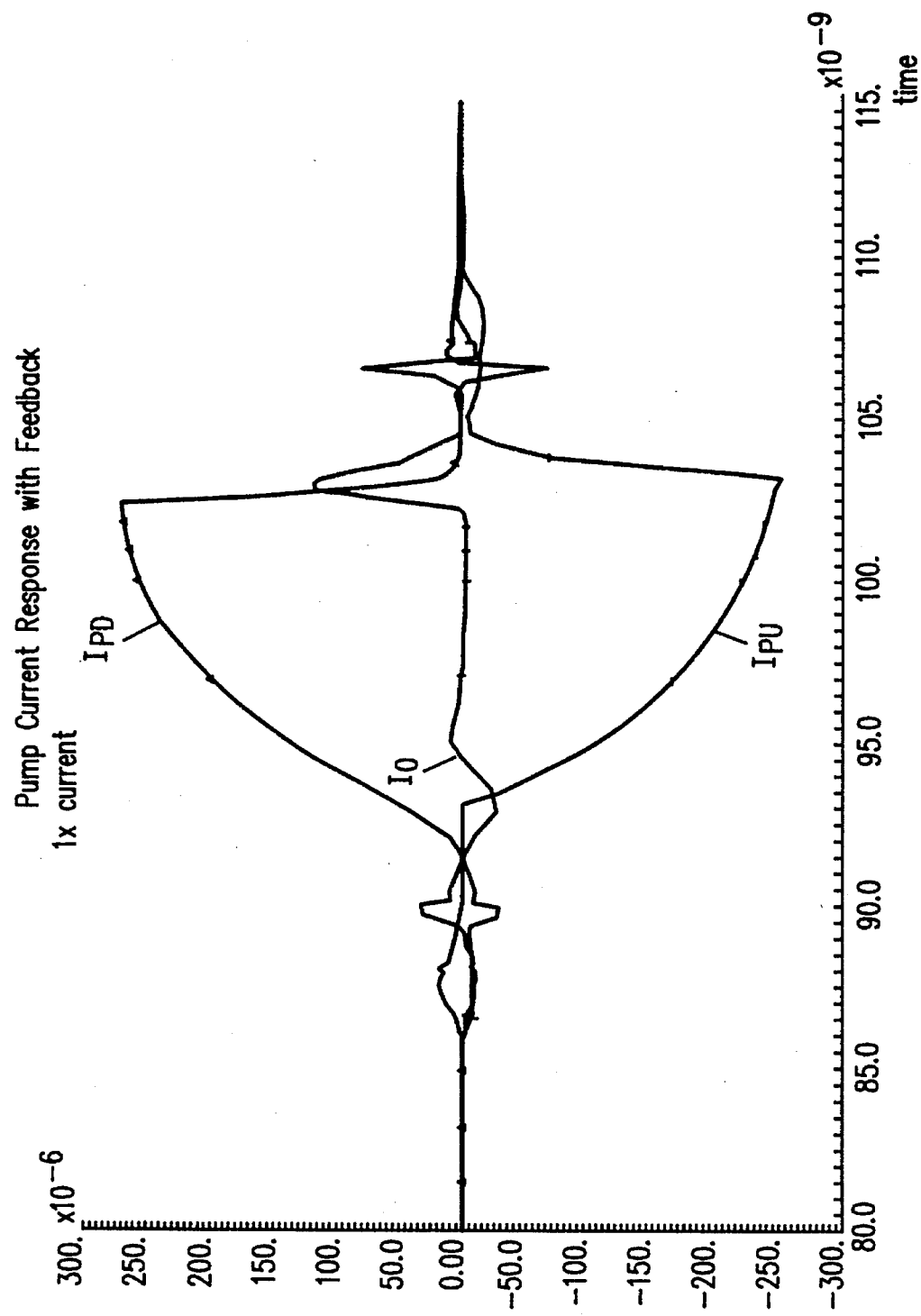
FIGS. 9A, 9B, 9C and 9D are timing diagrams of the output signal(s) for the charge pump circuit of FIGS. 8A, 8B and 8C.
Figure 9B:
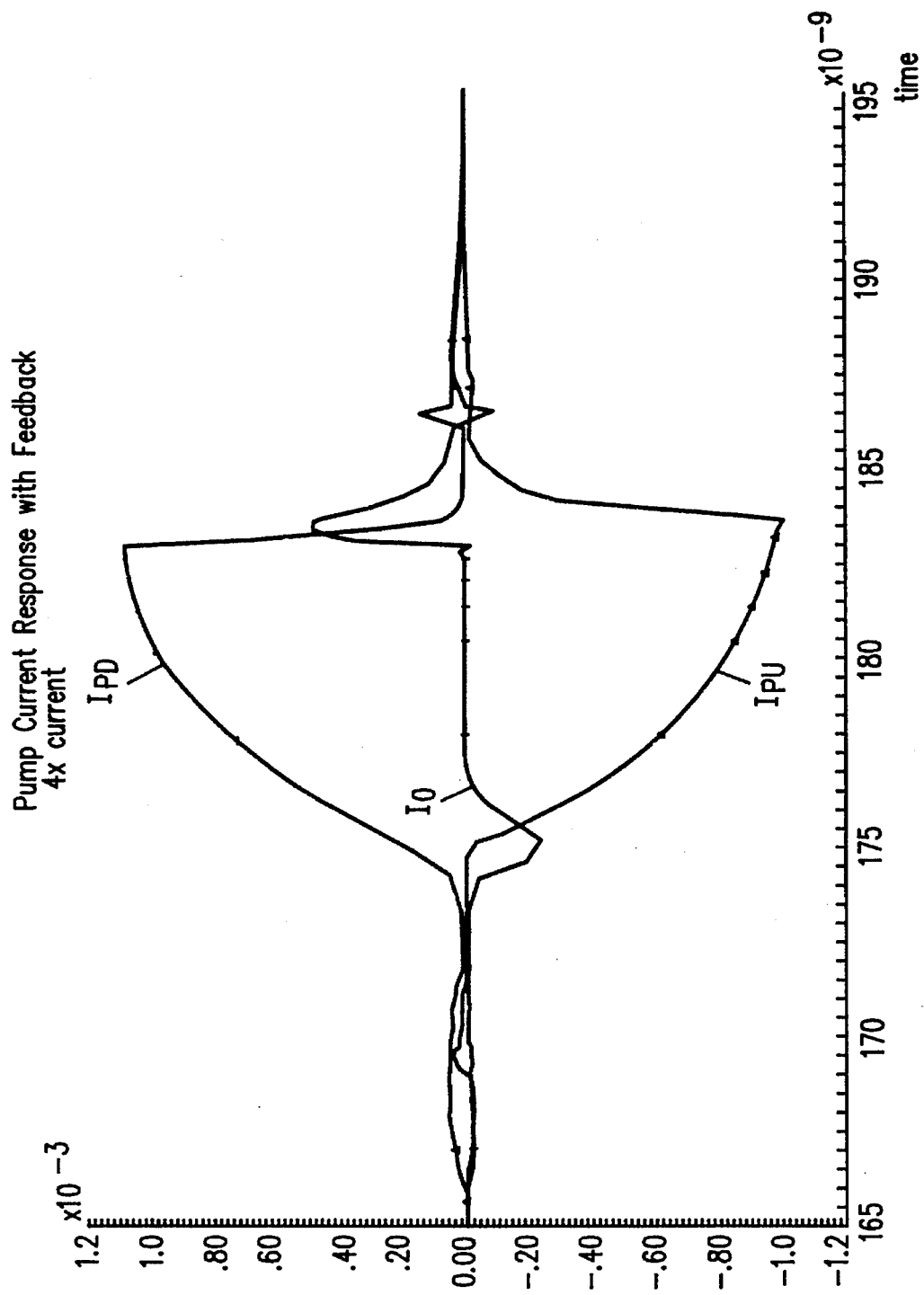
Figure 9C:
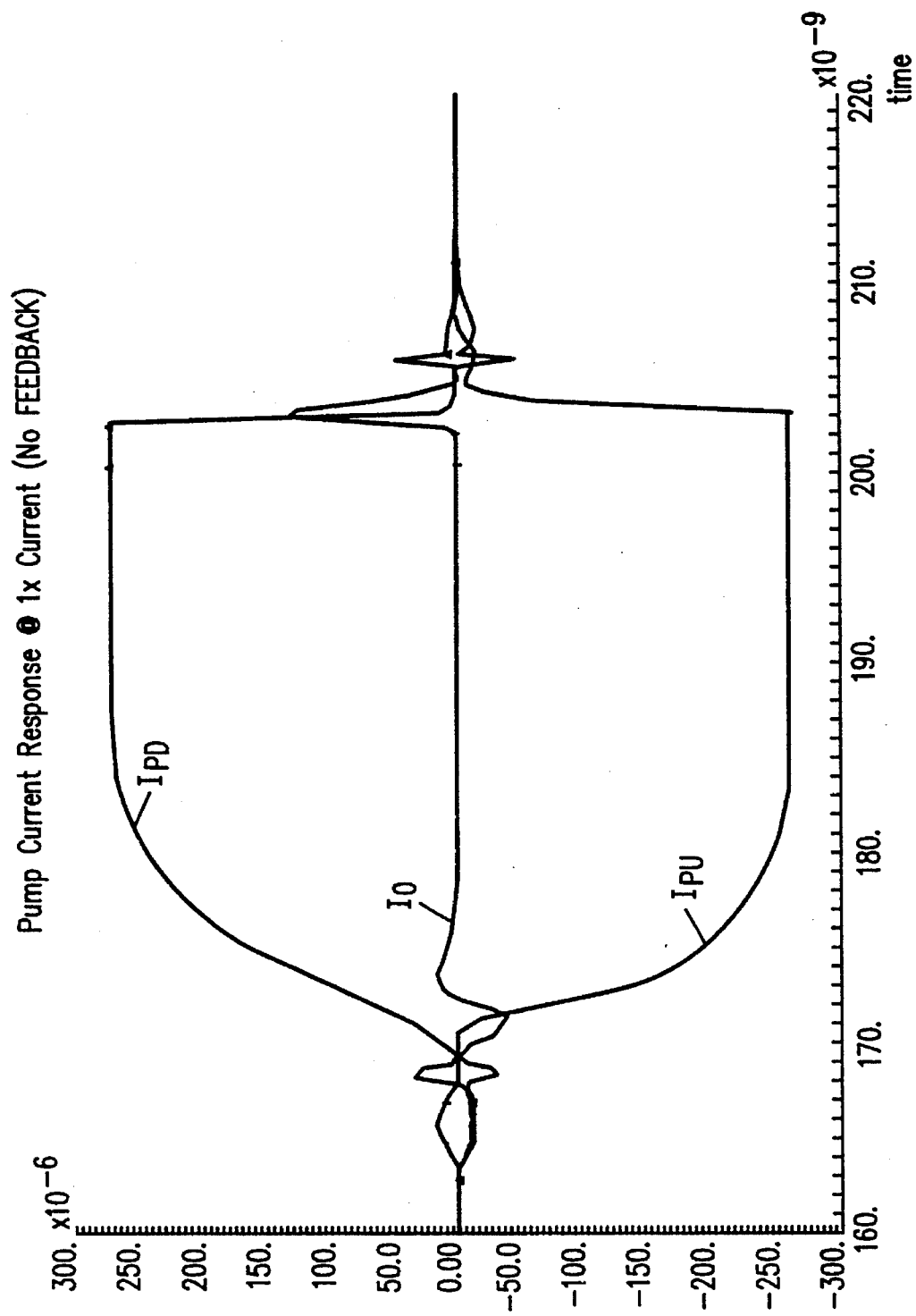
Figure 9D:
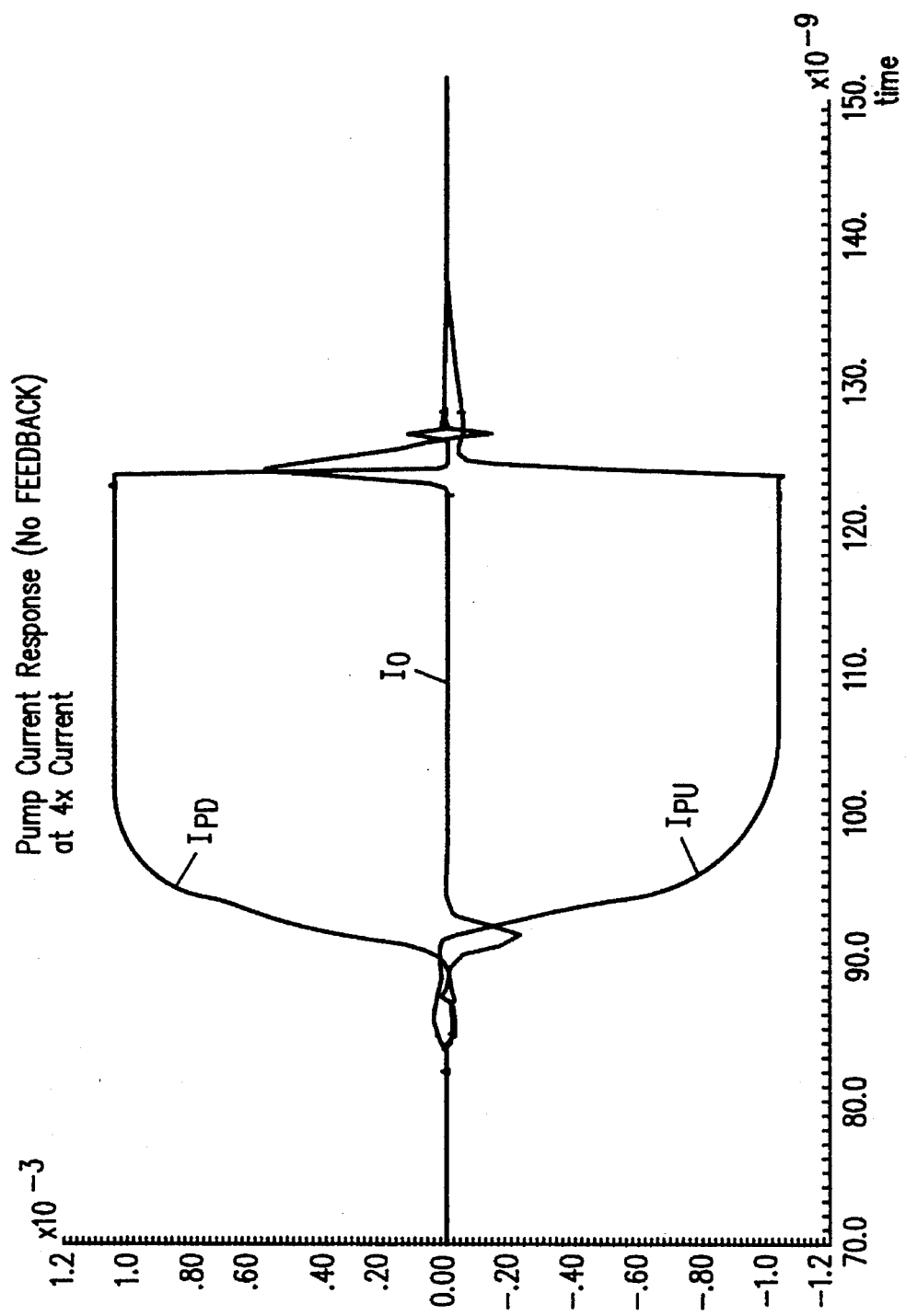

Referring to FIGS. 9A and 9B, the relative magnitudes and timing relationships between the pump-up $I_{PU}$ and pump-down $I_{PD}$ currents and the net output current $I_O$ are shown for both the "1X" and "4X" output current values, respectively. Accordingly, FIG. 9A corresponds to when the current select signal 201 is at a logic 0 and FIG. 9B corresponds to when the current select signal 201 is at a logic 1. (These particular waveforms show the pump current responses when feedback is used to the phase detector 202, as noted above and discussed further in the aforementioned U.S. Pat. No. 4,814,726. For comparison purposes, FIGS. 9C and 9D illustrate these current waveforms when no feedback to the phase detector 202 is used.)

Figure 10A:
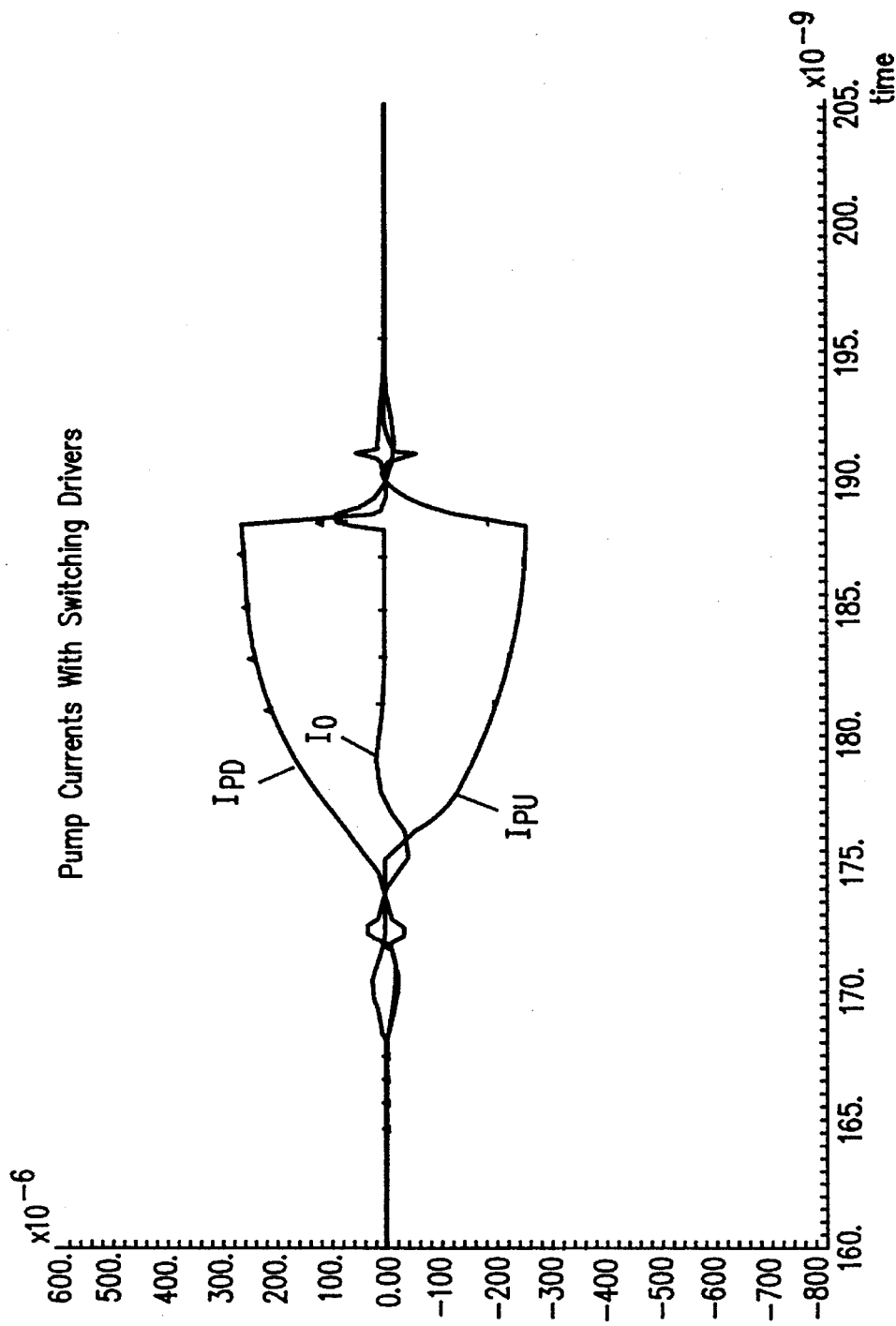
FIGS. 10A and 10B are timing diagrams of the output signal(s) for charge pump circuits in accordance with the embodiments of FIGS. 4 and 3, respectively.
Figure 10B:
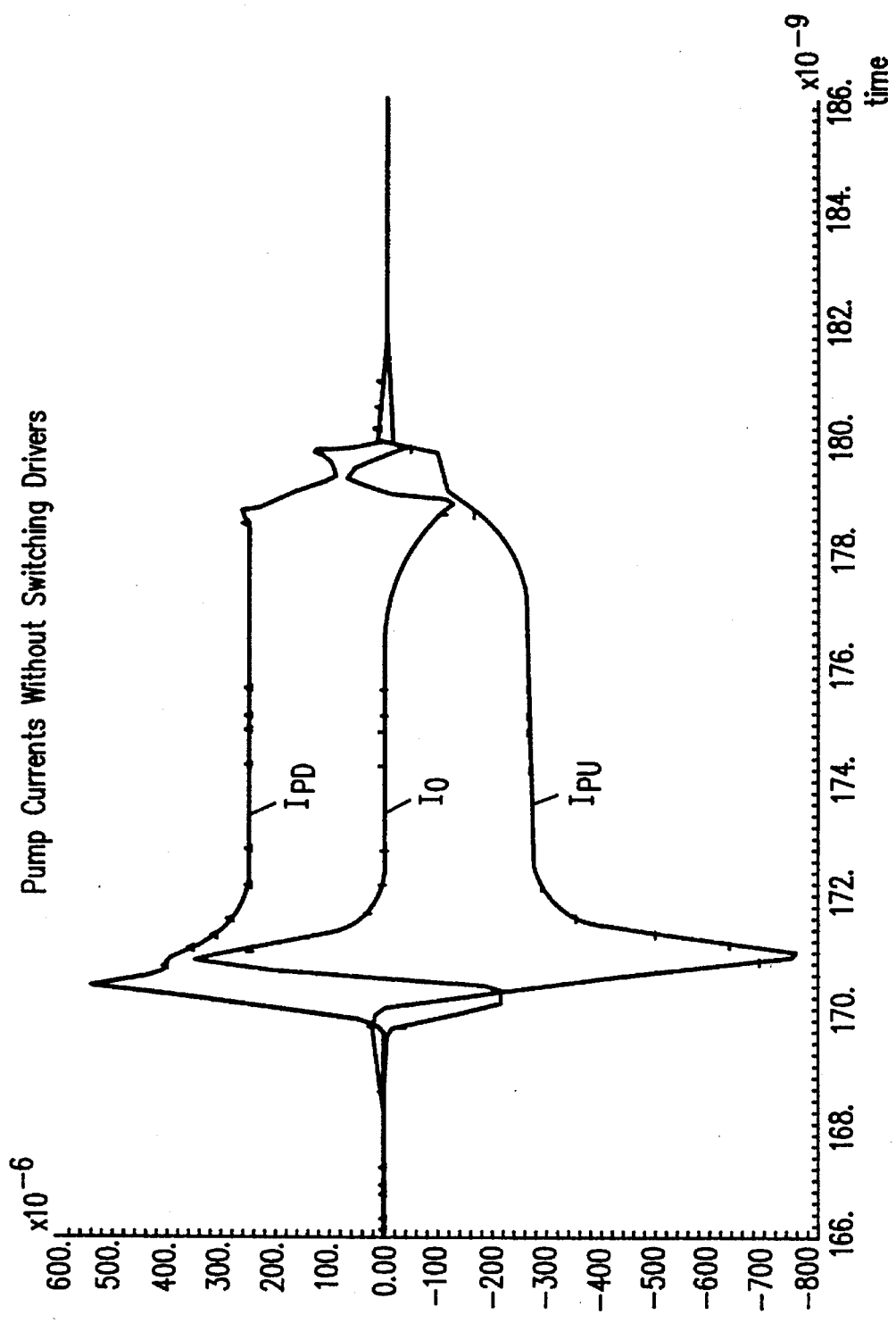

Referring to FIGS. 10A and 10B, the above-noted difference in performance between the circuit embodiments represented in FIGS. 4 and 3, respectively, can be better understood. FIG. 10A illustrates (similar to FIGS. 9A and 9B), the relative magnitudes and timing relationships between the pump-up $I_{PU}$, pump-down $I_{PD}$ and net output $I_O$ currents when using the output current control devices and reference current controllers in accordance with the foregoing discussion (e.g. as in a circuit embodiment in accordance with FIG. 4). For purposes of comparison, FIG. 10B illustrates these same currents when the output current control devices are used but no reference current controllers are used (e.g. as in a circuit embodiment in accordance with FIG. 3).

Based upon the foregoing discussion, it should be understood that a charge pump circuit with output current control devices in accordance with the present invention avoids the need for, and therefore the problems associated with, scaling down MOSFET device dimensions for minimizing leakage current effects. Further, it should be understood that a charge pump circuit with both output current control devices and reference current controllers in accordance with the present invention minimizes the generation of undesired transient or spurious output signals by providing a significantly more constant and stable output node voltage.

Further, in accordance with the foregoing discussion, it should be understood that other forms of current source circuits can be substituted for the exemplary current mirror circuits 102, 106 discussed above. For example, reference voltage sources (e.g. instead of reference current sources 116, 122) can be used to drive differential MOSFET amplifiers whose output voltages can then be converted to appropriate pump-up $I_{PU}$ and pump-down $I_{PD}$ currents.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a low leakage, metal oxide semiconductor field effect transistor (MOSFET) charge pump circuit, said MOSFET charge pump circuit comprising:

a first output current source including a first plurality of MOSFETs for sourcing a first output current, wherein said first plurality of MOSFETs includes a first plurality of MOSFET channels with a first plurality of channel widths;

a first output controller including a first MOSFET, coupled to said first output current source, for receiving a pump-up control signal and said first output current and in accordance therewith providing a pump-up current, wherein said first MOSFET includes a first MOSFET channel with a first channel width, and wherein said first channel width is substantially less than a sum of said first plurality of channel widths;

a second output current source including a second plurality of MOSFETs for sinking a second output current, wherein said second plurality of MOSFETs includes a second plurality of MOSFET channels with a second plurality of channel widths;

a second output controller including a second MOSFET, coupled to said second output current source, for receiving a pump-down control signal and a pump-down current and in accordance therewith providing said second output current, wherein said second MOSFET includes a second MOSFET channel with a second channel width, and wherein said second channel width is substantially less than a sum of said second plurality of channel widths; and an output node, coupling said first and second output controllers, for receiving said pump-up current and providing said pump-down current.

2. An apparatus as recited in claim 1, wherein said first plurality of MOSFETs comprises a first plurality of parallelly coupled MOSFETs for sourcing said first output current and said second plurality of MOSFETs comprises a second plurality of parallelly coupled MOSFETs for sinking said second output current.

3. An apparatus as recited in claim 1, wherein said first output current source comprises a first current mirror circuit for receiving a first reference current and in accordance therewith providing said first output current, and wherein said second output current source comprises a second current mirror circuit for receiving a second reference current and in accordance therewith providing said second output current.

4. An apparatus as recited in claim 3, wherein said first plurality of MOSFETs comprises a plurality of P-MOSFETs with substantially similar P-MOSFET channel dimensions, and wherein said second plurality of MOSFETs comprises a plurality of N-MOSFETs with substantially similar N-MOSFET channel dimensions.

5. An apparatus as recited in claim 3, further comprising first and second reference current sources, coupled to said first and second current mirror circuits, for providing said first and second reference currents, respectively.

6. An apparatus as recited in claim 1, wherein said first plurality of MOSFETs comprises a plurality of P-MOSFETs with substantially similar P-MOSFET channel dimensions, and wherein said second plurality of MOSFETs comprises a plurality of N-MOSFETs with substantially similar N-MOSFET channel dimensions.

7. An apparatus as recited in claim 1, wherein said first MOSFET comprises a first P-MOSFET for switching said first output current in accordance with said pump-up control signal to provide said pump-up current, and wherein said second MOSFET comprises a first N-MOSFET for switching said pump-down current in accordance with said pump-down control signal to provide said second output current.

8. An apparatus as recited in claim 7, wherein said first plurality of MOSFETs comprises a plurality of P-MOSFETs and said second plurality of MOSFETs comprises a plurality of N-MOSFETs, and wherein each one of said plurality of P-MOSFETs and said first P-MOSFET all have substantially similar P-MOSFET channel dimensions, and further wherein each one of said plurality of N-MOSFETs and said first N-MOSFET all have substantially similar N-MOSFET channel dimensions.

9. An apparatus as recited in claim 1, further comprising an integrated circuit into which said MOSFET charge pump circuit is integrated.

10. A method of providing an apparatus including a low leakage, metal oxide semiconductor field effect transistor (MOSFET) charge pump circuit, said method comprising the steps of:

providing a first output current source including a first plurality of MOSFETs for sourcing a first output current, wherein said first plurality of MOSFETs includes a first plurality of MOSFET channels with a first plurality of channel widths;

providing a first output controller including a first MOSFET, coupled to said first output current source, for receiving a pump-up control signal and said first output current and in accordance therewith outputting a pump-up current, wherein said first MOSFET includes a first MOSFET channel with a first channel width, and wherein said first channel width is substantially less than a sum of said first plurality of channel widths;

providing a second output current source including a second plurality of MOSFETs for sinking a second output current, wherein said second plurality of MOSFETs includes a second plurality of MOSFET channels with a second plurality of channel widths;

providing a second output controller including a second MOSFET, coupled to said second output current source, for receiving a pump-down control signal and a pump-down current and in accordance therewith outputting said second output current, wherein said second MOSFET includes a second MOSFET channel with a second channel width, and wherein said second channel width is substantially less than a sum of said second plurality of channel widths; and providing an output node, coupling said first and second output controllers, for receiving said pump-up current and outputting said pump-down current.

11. A method as recited in claim 10, wherein said step of providing a first output current source including a first plurality of MOSFETs comprises providing a first plurality of parallelly coupled MOSFETs for sourcing said first output current, and wherein said step of providing a second output current source including a second plurality of MOSFETs comprises providing a second plurality of parallelly coupled MOSFETs for sinking said second output current.

12. A method as recited in claim 10, wherein said step of providing a first output current source including a first plurality of MOSFETs comprises providing a first current mirror circuit for receiving a first reference current and in accordance therewith outputting said first output current, and wherein said step of providing a second output current source including a second plurality of MOSFETs comprises providing a second current mirror circuit for receiving a second reference current and in accordance therewith outputting said second output current.

13. A method as recited in claim 12, wherein said step of providing a first output current source including a first plurality of MOSFETs comprises providing a plurality of P-MOSFETs with substantially similar P-MOSFET channel dimensions, and wherein said step of providing a second output current source including a second plurality of MOSFETs comprises providing a plurality of N-MOSFETs with substantially similar N-MOSFET channel dimensions.

14. A method as recited in claim 12, further comprising the step of providing a reference current source, coupled to said first and second current mirror circuits, for generating said first and second reference currents.

15. A method as recited in claim 10, wherein said step of providing a first output current source including a first plurality of MOSFETs comprises providing a plurality of P-MOSFETs with substantially similar P-MOSFET channel dimensions, and wherein said step of providing a second output current source including a second plurality of MOSFETs comprises providing a plurality of N-MOSFETs with substantially similar N-MOSFET channel dimensions.

16. A method as recited in claim 10, wherein said step of providing a first output controller including a first MOSFET comprises providing a first P-MOSFET for switching said first output current in accordance with said pump-up control signal to output said pump-up current, and wherein said step of providing a second output controller including a second MOSFET comprises providing a first N-MOSFET for switching said pump-down current in accordance with said pump-down control signal to output said second output current.

17. A method as recited in claim 16, wherein said step of providing a first output current source including a first plurality of MOSFETs comprises providing a plurality of P-MOSFETs, and wherein said step of providing a second output current source including a second plurality of MOSFETs comprises providing a plurality of N-MOSFETs, and further wherein each one of said plurality of P-MOSFETs and said first P-MOSFET all have substantially similar P-MOSFET channel dimensions, and still further wherein each one of said plurality of N-MOSFETs and said first N-MOSFET all have substantially similar N-MOSFET channel dimensions.

18. A method as recited in claim 10, further comprising the step of providing an integrated circuit into which said MOSFET charge pump circuit is integrated.

19. A method of providing a charge pump signal with an apparatus including a low leakage, metal oxide semiconductor field effect transistor (MOSFET) charge pump circuit, said method comprising the steps of:

sourcing a first output current with a first output current source including a first plurality of MOSFETs which includes a first plurality of MOSFET channels with a first plurality of channel widths;

receiving a pump-up control signal and said first output current and in accordance therewith outputting a pump-up current with a first output controller including a first MOSFET with a first MOSFET channel having a first channel width which is substantially less than a sum of said first plurality of channel widths;

sinking a second output current with a second output current source including a second plurality of MOSFETs which includes a second plurality of MOSFET channels with a second plurality of channel widths;

receiving a pump-down control signal and a pump-down current and in accordance therewith outputting said second output current with a second output controller including a second MOSFET with a second MOSFET channel having a second channel width which is substantially less than a sum of said second plurality of channel widths; and receiving said pump-up current and outputting said pump-down current with an output node and in accordance therewith generating a charge pump signal.

20. A method as recited in claim 19, wherein said step of sourcing a first output current with a first output current source including a first plurality of MOSFETs comprises sourcing said first output current with a first plurality of parallelly coupled MOSFETs, and wherein said step of sinking a second output current with a second output current source including a second plurality of MOSFETs comprises sinking said second output current with a second plurality of parallelly coupled MOSFETs.

21. A method as recited in claim 19, wherein said step of sourcing a first output current with a first output current source including a first plurality of MOSFETs comprises receiving a first reference current and in accordance therewith sourcing said first output current with a first current mirror circuit, and wherein said step of sinking a second output current with a second output current source including a second plurality of MOSFETs comprises receiving a second reference current and in accordance therewith sinking said second output current with a second current mirror circuit.

22. A method as recited in claim 21, wherein said step of sourcing a first output current with a first output current source including a first plurality of MOSFETs further comprises sourcing said first output current with a plurality of P-MOSFETs having substantially similar P-MOSFET channel dimensions, and wherein said step of sinking a second output current with a second output current source including a second plurality of MOSFETs further comprises sinking said second output current with a plurality of N-MOSFETs having substantially similar N-MOSFET channel dimensions.

23. A method as recited in claim 21, further comprising the step of generating said first and second reference currents.

24. A method as recited in claim 19, wherein said step of sourcing a first output current with a first output current source including a first plurality of MOSFETs further comprises sourcing said first output current with a plurality of P-MOSFETs having substantially similar P-MOSFET channel dimensions, and wherein said step of sinking a second output current with a second output current source including a second plurality of MOSFETs further comprises sinking said second output current with a plurality of N-MOSFETs having substantially similar N-MOSFET channel dimensions.

25. A method as recited in claim 19, wherein said step of receiving a pump-up control signal and said first output current and in accordance therewith outputting a pump-up current with a first output controller comprises switching said first output current with a first P-MOSFET in accordance with said pump-up control signal to output said pump-up current, and wherein said step of receiving a pump-down control signal and a pump-down current and in accordance therewith outputting said second output current with a second output controller comprises switching said pump-down current with a first N-MOSFET in accordance with said pump-down control signal to output said second output current.

26. A method as recited in claim 25, wherein said step of sourcing a first output current with a first output current source including a first plurality of MOSFETs comprises sourcing said first output current with a plurality of P-MOSFETs, and wherein said step of sinking a second output current with a second output current source including a second plurality of MOSFETs comprises sinking said second output current with a plurality of N-MOSFETs, and further wherein each one of said plurality of P-MOSFETs and said first P-MOSFET all have substantially similar P-MOSFET channel dimensions, and still further wherein each one of said plurality of N-MOSFETs and said first N-MOSFET all have substantially similar N-MOSFET channel dimensions.

27. A method as recited in claim 19, further comprising the step of generating said charge pump signal with an integrated circuit.

* * * * *